United States Patent [19]

Weber

[11] Patent Number: 5,710,852
[45] Date of Patent: Jan. 20, 1998

[54] OPTICAL WAVEGUIDE FOR FIBER-OPTIC AMPLIFIERS FOR THE WAVELENGTH REGION AROUND 1550 NM

[75] Inventor: Dieter Weber, Kornwestheim, Germany

[73] Assignee: Alcatel NV, Netherlands

[21] Appl. No.: 462,702

[22] Filed: Jun. 5, 1995

[30] Foreign Application Priority Data

Jun. 10, 1994 [DE] Germany ............... 44 20 287.3

[51] Int. Cl.$^6$ .............................. G02B 6/02; G02B 6/16
[52] U.S. Cl. .................................... 385/123; 385/142
[58] Field of Search ................... 385/123, 142; 372/6

[56] References Cited

U.S. PATENT DOCUMENTS

| | | | |
|---|---|---|---|
| 4,666,793 | 5/1987 | Hirate | 428/690 |
| 4,962,995 | 10/1990 | Andrews et al. | |
| 5,237,576 | 8/1993 | DiGiovanni et al. | 372/6 |
| 5,274,734 | 12/1993 | Jin et al. | 385/123 |
| 5,278,850 | 1/1994 | Ainslie et al. | |
| 5,285,518 | 2/1994 | Elyamani et al. | |
| 5,303,318 | 4/1994 | Tateda et al. | 385/123 |
| 5,361,319 | 11/1994 | Antos et al. | 385/123 |
| 5,363,463 | 11/1994 | Kleinerman | 385/123 |
| 5,448,674 | 9/1995 | Vengsarkar et al. | 385/123 |
| 5,495,548 | 2/1996 | Bilodeau et al. | 385/123 |
| 5,499,313 | 3/1996 | Kleinerman | 385/123 |
| 5,555,342 | 9/1996 | Buchal et al. | 385/142 |

FOREIGN PATENT DOCUMENTS

| | | |
|---|---|---|
| 0371629 | 6/1990 | European Pat. Off. |
| 0466932 | 1/1992 | European Pat. Off. |
| 0516363 | 12/1992 | European Pat. Off. |
| 4120054 | 1/1992 | Germany |
| 4209004 | 9/1993 | Germany |
| 9400329 | 9/1994 | WIPO |
| 9421010 | 9/1994 | WIPO |

OTHER PUBLICATIONS

Patent Abstracts of Japan, vol. 015 No. 100 (C-0895) 18 Dec. 1991 & JP-A-3 218 946 Kokusai Denshin Denwa Co. Ltd. Sep. 26, 1991.

Haist, W. "Optische Telekommunikations systeme". BD.I: Physik und Technik, Damm–Verlag KG, Gelsenkirchen-–Buer, 1989, S.18. No month.

Keiser, Gerd "Optical Fiber Communications", McGraw-Hill, Inc. New York, 1991 S. 61, 62. No month.

Ainslie, James, B. "A Review of the Fabrication and Properties of Erbium–Doped Fibers for Optical Amplifiers". In IEEE Journal of Lightwave Technology, vol. 9, No.2, Feb. 1991, pp.220–227.

Urguhart, paul, "Review of rare earth doped fibre laser and amplifiers" In: IEE Proceedings, vol. 135, Ptj, No. 6, Dec. 1988, pp. 385–407.

Schneider et al, "Herstellverfahren und Ausführungsformen von Lichtwellenleitern" telcom report 6 (1983) Beiheft Nachrichtenübertragung mit licht. No month, no translation.

Patent Abstracts of Japan, vol. 015 No. 126 (C-0817) 27 Mar. 1991 & JP-A-03 008744 (Shin Etsu Chem Co Ltd. Others : 01) 16 Jan. 1991.

Patent Abstracts of Japan, vol. 016 No. 320 (C-0962) 15 Jul. 1992, & JP=A-04092825 (Fujikura Ltd) 25 Mar. 1992.

Patent Abstracts of Japan, vol. 012 No. 237 (C-509) 6 Jul. 1988 & JP-A-63 030343 (Sumitomo Electric Ind. LTd) 9 Feb. 1988.

*Primary Examiner*—Rodney B. Bovernick
*Assistant Examiner*—Robert E. Wise
*Attorney, Agent, or Firm*—Ware, Fressola, Van Der Sluys & Adolphson LLP

[57] ABSTRACT

An optical waveguide for fiber-optic amplifiers is disclosed where the Progression of the fluorescence band of optical waveguides that are doped with erbium and aluminum can be additionally flattened if the core contains fluorine, e.g., in the form of $ErF_3$ and $AlF_3$, as an additional doping agent.

8 Claims, 2 Drawing Sheets

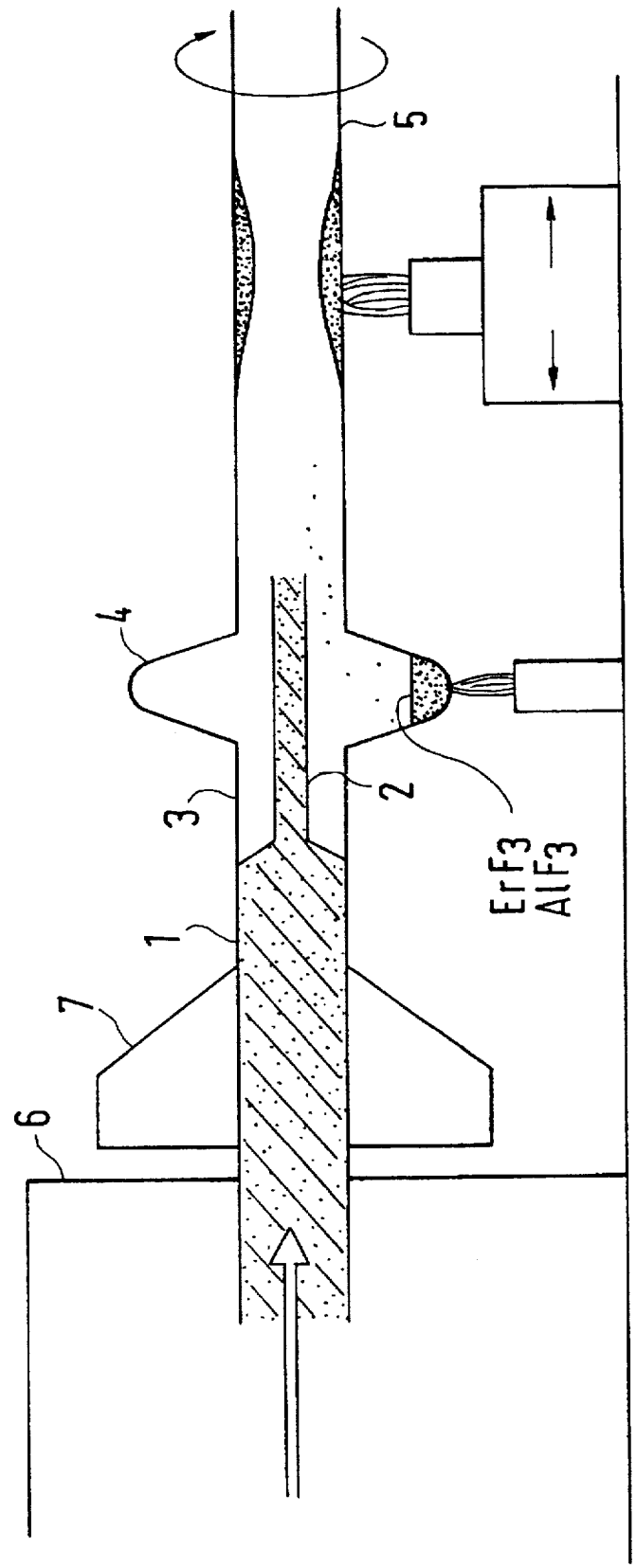

OPTICAL WAVEGUIDE FOR FIBER-OPTIC AMPLIFIERS FOR THE WAVELENGTH REGION AROUND 1550 NM

TECHNICAL FIELD

The present invention relates to optical waveguides for use as fiber-optic amplifiers.

BACKGROUND OF THE INVENTION

The Journal of Lightwave Technology, Vol. 9, No. 2, February 1991, pp. 220–227, reveals that light within the wavelength region around 1530 nm can be amplified with optical waveguides if their core contains erbium as the laser material. Based on this method, fiber-optic amplifiers have been constructed which are utilized with enormous success in systems that operate within the wavelength region around 1530 nm.

In known optical waveguides used for fiber-optic amplifiers, the florescence band, i.e., the amplification plotted as a function of the wavelength, reaches its maximum value within the region around 1530 nm. However, this fluorescence band is not optimal because it reaches a defined maximum at a certain wavelength. It would be desirable to realize a fluorescence band in which no defined maximum occurs at a certain wavelength, but in which the progression of the fluorescence as a function of the wavelength is flattened. An amplifying optical waveguide with these properties is able to utilize a wider wavelength region for the transmission of information. The aforementioned publication also discloses that the fluorescence band can be significantly widened if the core contains aluminum in addition to erbium.

SUMMARY OF THE INVENTION

The invention is based on the objective of proposing an amplifying optical waveguide in which the florescence band is made even wider and flatter.

According to the invention, this technological problem is solved by the fact that the core additionally contains fluorine that is combined with erbium.

European Patent No. A 0,466,932 discloses a method in which a fluoride of a rare-earth element is introduced into porous blank molds that are additionally processed into glass rods because the fluorides have relatively low melting points (p. 8). It is also known to heat the porous blank molds in an oxygen atmosphere before the sintering process and (p. 9, lines 9–12) sinter the porous blank molds in a helium atmosphere that contains oxygen in such a way that the glass rods created during the sintering process contain erbium and fluorine, with the erbium being combined with the oxygen ($Er_2O_3$) and the fluorine not being chemically combined with another element (p. 11, line 56).

The present invention is directed to an optical waveguide consisting of silicon dioxide as the base material and comprising a core, a cladding and one or more doping agents that increase the refractive index, with erbium and aluminum being contained in the core, characterized by the fact that the core additionally contains fluorine that is combined with the erbium. One advantageous method for manufacturing the new optical waveguide is where the core material is produced on a substrate by means of precipitation from a chemical vapor-phase reaction and the material so produced is additionally processed into an optical waveguide, characterized by the fact that a complex is formed of the erbium trifluoride ($ErF_3$) and another compound, and that said complex is fed to the substrate in the form of a vapor together with the starting materials of the chemical vapor-phase reaction such that the product of the chemical vapor-phase reaction and the complex precipitate on said substrate.

One additional aspect of the invention is that a new fiber-optic amplifier can be created with the new optical waveguide.

The method may also use aluminum trifluoride ($AlF_3$) or boron trifluoride ($BF_3$) or another compound that forms a complex with erbium trifluoride $E_rF_3$) as the compound for forming the complex.

The method may use a quartz glass tube as the substrate. In this method, the starting materials of the chemical vapor-phase reaction are introduced into the substrate tube. The method is characterized by the fact that the starting materials of the chemical vapor-phase reaction are introduced into the substrate tube together with the formed complex that is present in the form of a vapor such that the interior of the substrate tube is coated due to the precipitation of the product of the chemical vapor-phase reaction and the complex, and that the substrate tube, the interior of which has been coated, is additionally processed into an optical waveguide in customary fashion.

BRIEF DESCRIPTION OF THE DRAWINGS

Advantageous details of the invention are illustrated in FIGS. 1–3. The figures show:

FIG. 3 a device for carrying out the method for manufacturing the amplifying optical waveguide.

BEST MODE FOR CARRYING OUT THE INVENTION

Figure 1:
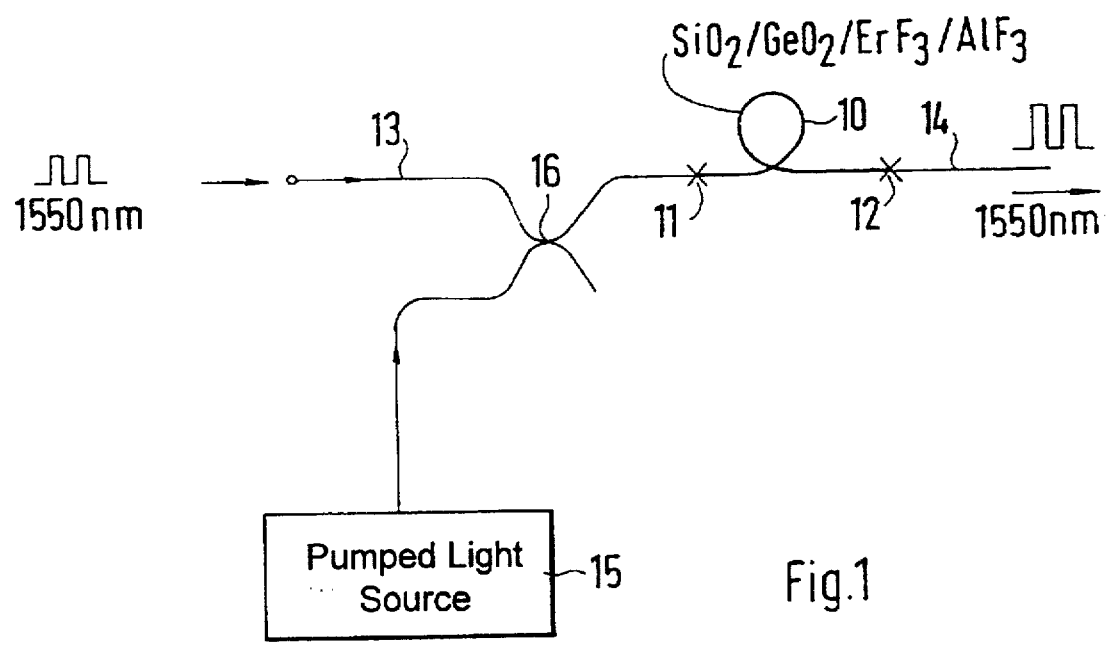
FIG. 1 a fiber-optic amplifier for the wavelength region around 1550 nm with the new optical waveguide as the amplifying optical waveguide.

The reference numeral 10 in FIG. 1 identifies a schematically indicated amplifying optical waveguide for a fiber-optic amplifier. This fiber-optic amplifier is connected with an optical waveguide 13 that guides the optical input signal to be amplified and an optical waveguide 14 that guides the amplified optical output signal of the fiber-optic amplifier at the splicing points 11 and 12. A pumped light source 15 which in the embodiment shown is coupled to the optical waveguide 13 by means of a coupler 16 is provided in customary fashion for the fiber-optic amplifier. In order to differentiate the amplifying optical waveguide 10 from the normal optical waveguides 13 and 14, the amplifying optical waveguide is, although it has the same diameter, drawn with thicker lines, as is customary in such illustrations. The wavelength of the light that travels through such a fiber-optic amplifier lies within the region of 1550 nm. A digital signal is indicated as the signal at the input and the output, with the signal at the output being illustrated as an amplified signal.

It is essential for the invention that the optical waveguide which is intended as an amplifying optical waveguide for the region around 1550 nm has the following composition:

silicon dioxide serves as the base material of the entire optical waveguide; a doping agent that increases the refractive index, e.g., $GeO_2$, is contained in customary fashion in the core of the optical waveguide; the core also contains erbium as the laser material, aluminum for widening the erbium fluorescence band and, according to the invention, fluorine. The composition of the cladding is not important. However, it is important that the erbium be combined with the fluorine, i.e., that the erbium be surrounded by fluorine ions. The fluorine ions cannot be displaced by oxygen ions. Due to the fact that the erbium is surrounded with fluorine, the erbium has the desired laser characteristics that are required for the amplification of light within the wavelength region around 1550 nm. One possibility for ensuring that the erbium is surrounded by fluorine consists of the fact that the erbium and the fluorine are contained in the core in the form of the compound erbium trifluoride ($ErF_3$). It is also preferred that aluminum be contained in the core in the form of the compound aluminum trifluoride ($AlF_3$).

Figure 2:
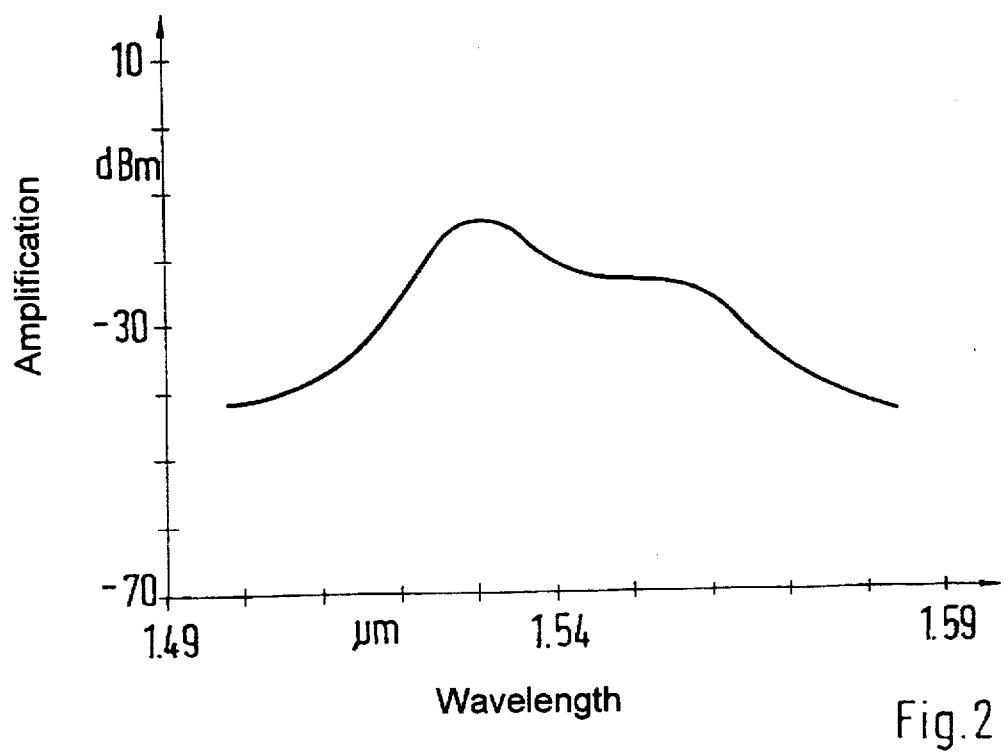
FIG. 2 the fluorescence band of an amplifying optical waveguide according to the invention.

FIG. 2 shows that the fluorescence band of the amplifying optical waveguide according to the invention has a nearly constant intensity over a broad region between 1520 and 1560 nm.

Any method that makes it possible to introduce the erbium, the aluminum and the fluorine in the form of a compound into the core of an optical waveguide that consists of silicon dioxide as the base material can be considered for manufacturing the optical waveguide according to the invention.

According to one particularly advantageous method, the erbium trifluoride as a complex with the aluminum trifluoride is in the form of a vapor conveyed into the vicinity of a substrate together with the starting materials of a chemical vapor-phase reaction that creates the core material such that it can precipitate on the substrate together with the products of the chemical vapor-phase reaction. The chemical vapor-phase reaction can, for example, be carded out in accordance with the known MCVD method in a substrate tube such that the inside of said substrate tube is coated. One such method is described below as an example for one method for the precipitation from a chemical vapor-phase reaction.

As an alternative to such a MCVD method in which the substrate is a quartz glass tube and the interior is coated, it is also possible to use a rod-shaped arbor that is coated on its outer surface or it can be a base that revolves around its axis, where the glass material of the core and possibly also the glass material of the cladding is created by means of a deposition process from a vapor-phase reaction in the axial direction. The principle of these three known variations of the decomposition from a chemical vapor-phase reaction is known from the publication "telecom report," 6 (1983) Beiheft: Optical communication, pages 29–35.

It is essential for the preferred method for manufacturing the new optical waveguide that the erbium fluoride be conveyed to the substrate together with the aluminum trifluoride and the starting materials of the chemical vapor-phase reaction that is used for producing the core glass material such that it is able to precipitate on the substrate together with the product of the chemical vapor-phase reaction.

One embodiment of a preferred method is described below with reference to FIG. 3. which shows a device for carrying out the method.

The manufacture of an amplifying optical waveguide is carried out by means of an optical waveguide blank mold in accordance with the MCVD method in which a rotating substrate tube that usually consists of quartz glass and is clamped into a glass lathe is coated with the cladding or core layers consisting of an artificial glass in several steps. The starting materials for the cladding or core layers are conveyed into the substrate tube in a gaseous form. Due to the progressive heating of the substrate tube in the longitudinal direction by means of an oxyhydrogen gas burner, an artificial glass layer of certain composition is progressively produced on the inner wall of the substrate tube by precipitation from the chemical vapor-phase reaction. The length of the substrate tube usually amounts to 1250 nm. Silicon tetrachloride ($SiCl_4$), germanium tetrachloride ($GeCl_4$), phosphorus oxytrichloride ($POCl_3$) and, if necessary, hexafluoroethane ($C_2F_6$) together with oxygen and helium can be used as the starting materials for the manufacture of the layers consisting of artificial glass.

FIG. 3 shows a portion of a device for carrying out the method according to the invention which is clamped into a glass lathe. This device consists of a tube 1 that has a larger diameter at the left end. Its diameter approximately corresponds with the diameter of the substrate tube 5. The tube 1 is tapered so as to form a tube 2 of smaller diameter approximately in the center of the device; its total length amounts to approximately 350 nm. The tube 2 is surrounded by another tube 3 of larger diameter which is closed at the left end, connected with the tube 1 and provided with a rotationally symmetrical thickening 4.

The substrate tube 5 to be coated, which, for example, has a length of 900 nm, is melted onto the right end of the tube 3. The left end of the device, i.e., the tube 1, is arranged in a rotatable fashion in the glass lathe 6 and turned by the drive 7.

While operating the device, the materials required for carrying out the method according to the invention, namely erbium trifluoride ($ErF_3$) and aluminum trifluoride ($AlF_3$), are contained in the thickening 4. The starting materials aluminum trifluoride and erbium trifluoride are available in powder form. These starting materials are filled into the thickening. The thickening 4 and the materials contained therein are not heated during the manufacture of the cladding glass layer. The thickening 4 and consequently the materials contained therein are only heated to approximately 1350° C. when the core layer should be produced. During this process, the mixture consisting of erbium trifluoride and aluminum trifluoride is converted into the gas phase and entrained by the introduced gas. In order to stabilize the elemental fluoride system, a component that contains fluoride, e.g., hexafluoroethane, can also be carried. The components silicon dioxide, germanium dioxide, erbium trifluoride and aluminum trifluoride precipitate on the inner surface of the substrate tube 5 and are vitrified by the ensuing heat source, e.g., an oxyhydrogen gas burner.

When carrying out the proposed method for manufacturing the optical waveguide blank mold with a core layer that is doped with erbium, aluminum and fluorine, it is practical to produce one additional core layer without the aforementioned doping in an additional production step after producing the core layer and subsequently remove approximately 70% of the total thickness of the first and second core layers by etching, e.g., with hexafluoroethane, before collapsing the substrate tube. This measure results in a concentration of the erbium in the center of the core of the optical waveguide such that the amplification effect is increased.

Instead of using aluminum, the core can also contain a different element. It is possible to consider any element that contributes to the flattening of the fluorescence curve similar to aluminum and is able to form a compound that forms a complex with the $ErF_3$ such that the $ErF_3$ can be converted into the vapor phase at relatively low temperatures (e.g., 1350° C.). Boron can be considered as one possibility for such an element. A compound consisting of boron, fluorine and boron trifluoride ($BF_3$) which is a gas at room temperature can be conveyed over heated $ErF_3$ and forms a complex with the ErF$_3$ which is subsequently conveyed to the location of the desired precipitation on a substrate in a gaseous form.

What is claimed is:

1. An improved optical waveguide having silicon dioxide as the base material, the improved optical waveguide comprising:
   A) a core comprising:
      1) at least one doping agent to increase the refractive index of the base material,
      2) erbium,
      3) aluminum, and
      4) fluorine, wherein the erbium is combined with at least some of the fluorine so that the erbium is surrounded by the fluorine; and
   B) a cladding formed around the core.

2. An improved optical waveguide as defined in claim 1, further wherein the erbium and at least some of the fluorine are combined in the form of erbium trifluoride (ErF$_3$).

3. An improved optical waveguide as defined in claim 2, further wherein the aluminum and at least some of the fluorine are combined in the form of aluminum trifluoride (AlF$_3$).

4. An improved optical waveguide having silicon dioxide as the base material, the improved optical waveguide comprising:
   A) a core comprising:
      1) at least one doping agent to increase the refractive index of the base material,
      2) erbium,
      3) boron, and
      4) fluorine;
      wherein the erbium is combined with at least some of the fluorine so that the erbium is surrounded by the fluorine; and
   B) a cladding formed around the core.

5. An improved optical waveguide having silicon dioxide as the base material, the improved optical waveguide comprising:
   A) a core comprising:
      1) at least one doping agent to increase the refractive index of the base material,
      2) erbium,
      3) fluorine, wherein the erbium is combined with at least some of the fluorine to form erbium trifluoride (ErF$_3$) so that the erbium is surrounded by the fluorine;
      4) an element capable of forming a compound that forms a complex with the erbium trifluoride; and
   B) a cladding formed around the core.

6. An improved optical waveguide as defined in claim 5, wherein the element capable of forming a compound that forms a complex with the erbium trifluoride is boron.

7. A fiber-optic amplifier for amplifying an optical input signal received on a first optical waveguide (13) and for transmitting an amplified optical signal on a second optical waveguide (14), comprising:
   A) a pumped light source (15);
   B) an optical coupler connected to the first optical waveguide and the pumped light source for coupling the optical input signal with the output of the pumped light source; and
   C) an amplifying optical waveguide (10) connected to the optical coupler and to the second optical waveguide for presenting an amplified optical signal of the optical input signal to the second optical waveguide, said amplifying optical waveguide having silicon dioxide as the base material, the said amplifying optical waveguide comprising:
      1) a core comprising:
         a) at least one doping agent to increase the refractive index of the base material,
         b) erbium,
         c) aluminum, and
         d) fluorine, wherein the erbium is combined with at least some of the fluorine so that the erbium is surrounded by the fluorine; and
      2) a cladding formed around the core.

8. A fiber-optic amplifier for amplifying an optical input signal received on a first optical waveguide (13) and for transmitting an amplified optical signal on a second optical waveguide (14), comprising:
   A) a pumped light source (15);
   B) an optical coupler connected to the first optical waveguide and the pumped light source for coupling the optical input signal with the output of the pumped light source; and
   C) an amplifying optical waveguide (10) connected to the optical coupler and to the second optical waveguide for presenting an amplified optical signal of the optical input signal to the second optical waveguide, said amplifying optical waveguide having silicon dioxide as the base material comprising:
      1) a core comprising:
         a) at least one doping agent to increase the refractive index of the base material,
         b) erbium,
         c) boron, and
         d) fluorine, wherein the erbium is combined with at least some of the fluorine so that the erbium is surrounded by the fluorine; and
      2) a cladding formed around the core.

* * * * *